(12) United States Patent
Bragin et al.

(10) Patent No.: US 6,785,316 B1
(45) Date of Patent: Aug. 31, 2004

(54) EXCIMER OR MOLECULAR LASER WITH OPTIMIZED SPECTRAL PURITY

(75) Inventors: Igor Bragin, Goettingen (DE); Vadim Berger, Goettingen (DE); Uwe Stamm, Goettingen (DE)

(73) Assignee: Lambda Physik AG, Goettingen (DE)

( * ) Notice: Subject to any disclaimer, the term of this patent is extended or adjusted under 35 U.S.C. 154(b) by 590 days.

(21) Appl. No.: 09/640,595

(22) Filed: Aug. 17, 2000

Related U.S. Application Data
(60) Provisional application No. 60/149,392, filed on Aug. 17, 1999.

(51) Int. Cl.[7] .......................... H01S 3/097; H01S 3/22; H01S 3/223
(52) U.S. Cl. .................. 372/87; 372/38.07; 372/57
(58) Field of Search ................ 372/25, 38.07, 372/57, 86

(56) References Cited

U.S. PATENT DOCUMENTS

| | | | |
|---|---|---|---|
| 4,240,044 A | 12/1980 | Fahlen et al. | 331/94.5 PE |
| 4,380,079 A | 4/1983 | Cohn et al. | 372/87 |
| 4,399,540 A | 8/1983 | Bücher | 372/20 |
| 4,611,270 A | 9/1986 | Klauminzer et al. | 364/183 |
| 4,686,682 A | 8/1987 | Haruta et al. | 372/87 |
| 4,691,322 A | 9/1987 | Nozue et al. | 372/82 |
| 4,718,072 A | 1/1988 | Marchetti et al. | 372/86 |
| 4,719,637 A | 1/1988 | Cavioli et al. | 372/59 |
| 4,829,536 A | 5/1989 | Kajiyama et al. | 372/57 |
| 4,856,018 A | 8/1989 | Nozue et al. | 372/99 |
| 4,860,300 A | 8/1989 | Bäumler et al. | 372/57 |
| 4,819,818 A | 1/1990 | Levatter | 372/57 |
| 4,905,243 A | 2/1990 | Lokai et al. | 372/32 |
| 4,926,428 A | 5/1990 | Kajiyama et al. | 370/20 |
| 4,953,174 A | 8/1990 | Eldridge et al. | 372/87 |
| 4,975,919 A | 12/1990 | Amada et al. | 372/33 |
| 4,977,563 A | 12/1990 | Nakatani et al. | 372/32 |

(List continued on next page.)

FOREIGN PATENT DOCUMENTS

| | | | |
|---|---|---|---|
| DE | 44 01 892 A1 | 1/1994 | H01S/3/038 |
| DE | 44 01 892 A1 | 7/1996 | H01S/3/038 |
| EP | 0 32 751 A1 | 2/1991 | H01S/3/038 |
| EP | 0 532 751 B1 | 2/1991 | H01S/3/038 |
| EP | 1 085 623 A2 | 3/2001 | H01S/3/0971 |
| JP | 61-91982 | 10/1984 | H01S/3/03 |
| JP | 61-116889 | 10/1984 | H02S/3/04 |
| JP | 3009582 A | 1/1991 | H01S/003/038 |
| WO | WO 96/25778 | 8/1996 | H01S/3/00 |

OTHER PUBLICATIONS

Patent Abstracts of Japan, Publication No. 04109684, Oct. 4, 1992, 1 sheet of paper.

(List continued on next page.)

*Primary Examiner*—Paul Ip
*Assistant Examiner*—Davienne Monbleau
(74) *Attorney, Agent, or Firm*—Sierra Patent Group, Ltd.; Andrew V. Smith

(57) ABSTRACT

A final stage capacitance of a pulse compression circuit for an excimer or molecular fluorine lithography laser system is provided by a set of peaking capacitors connected through a first inductance to the electrodes and a set of sustaining capacitors connected to the electrodes through a second inductance substantially greater than the first inductance. Current pulses through the discharge are temporally extended relative to current pulses of a system having its final stage capacitance provided only by a set of peaking capacitors connected to the electrodes via the first inductance. An amplified spontaneous emission (ASE) level in the laser pulses is reduced thereby enhancing their spectral purity.

33 Claims, 3 Drawing Sheets

U.S. PATENT DOCUMENTS

| | | | |
|---|---|---|---|
| 5,025,445 A | 6/1991 | Anderson et al. ............. | 372/20 |
| 5,095,492 A | 3/1992 | Sandstrom .................. | 372/102 |
| 5,142,543 A | 8/1992 | Wakabayashi et al. ........ | 372/32 |
| 5,150,370 A | 9/1992 | Furuya et al. .............. | 372/106 |
| 5,181,217 A * | 1/1993 | Sato et al. .................... | 372/38 |
| 5,221,823 A | 6/1993 | Usui ..................... | 219/121.78 |
| 5,226,050 A | 7/1993 | Burghardt .................... | 372/20 |
| 5,247,531 A | 9/1993 | Müller-Horsche ............ | 372/38 |
| 5,247,534 A | 9/1993 | Müller-Horsche et al. .... | 372/102 |
| 5,247,535 A | 9/1993 | Müller-Horsche et al. .... | 372/86 |
| 5,309,462 A | 5/1994 | Taylor et al. ................. | 372/38 |
| 5,313,481 A | 5/1994 | Cook et al. .................. | 372/37 |
| 5,319,665 A | 6/1994 | Birx ........................... | 372/69 |
| 5,337,330 A | 8/1994 | Larson ....................... | 372/86 |
| 5,396,514 A | 3/1995 | Voss ........................... | 372/57 |
| 5,404,366 A | 4/1995 | Wakabayashi et al. ........ | 372/29 |
| 5,450,207 A | 9/1995 | Fomenkov et al. ......... | 356/416 |
| 5,463,650 A | 10/1995 | Ito et al. ...................... | 372/57 |
| 5,535,233 A | 7/1996 | Mizoguchi et al. ........... | 372/87 |
| 5,557,629 A | 9/1996 | Mizoguchi et al. ........... | 372/87 |
| 5,559,584 A | 9/1996 | Miyaji et al. ................. | 355/73 |
| 5,559,815 A * | 9/1996 | Berger et al. ................. | 372/25 |
| 5,559,816 A | 9/1996 | Basting et al. ................ | 372/57 |
| 5,586,134 A | 12/1996 | Das et al. ..................... | 372/38 |
| 5,596,596 A | 1/1997 | Wakabayashi et al. ...... | 372/102 |
| 5,659,419 A | 8/1997 | Lokai et al. ................. | 359/330 |
| 5,663,973 A | 9/1997 | Stamm et al. ................ | 372/20 |
| 5,684,822 A | 11/1997 | Partlo .......................... | 372/95 |
| 5,710,787 A | 1/1998 | Amada et al. ................ | 372/25 |
| 5,729,562 A | 3/1998 | Birx et al. .................... | 372/38 |
| 5,729,565 A | 3/1998 | Meller et al. ................. | 372/87 |
| 5,748,346 A | 5/1998 | David et al. .................. | 359/15 |
| 5,754,579 A | 5/1998 | Mizoguchi et al. ........... | 372/58 |
| 5,761,236 A | 6/1998 | Kleinschmidt et al. ..... | 372/100 |
| 5,763,855 A | 6/1998 | Shioji .................... | 219/121.84 |
| 5,771,258 A | 6/1998 | Morton et al. ................ | 372/57 |
| 5,802,094 A | 9/1998 | Wakabayashi et al. ....... | 372/57 |
| 5,811,753 A | 9/1998 | Weick et al. .......... | 219/121.78 |
| 5,818,865 A | 10/1998 | Watson et al. ................ | 372/86 |
| 5,835,520 A | 11/1998 | Das et al. ..................... | 372/57 |
| 5,852,627 A | 12/1998 | Ershov ....................... | 372/108 |
| 5,856,991 A | 1/1999 | Ershov ........................ | 372/57 |
| 5,898,725 A | 4/1999 | Fomenkov et al. ......... | 372/102 |
| 5,901,123 A | 5/1999 | Ershov ........................ | 372/20 |
| 5,914,974 A | 6/1999 | Partlo et al. .................. | 372/38 |
| 5,917,849 A | 6/1999 | Ershov ....................... | 372/102 |
| 5,923,693 A | 7/1999 | Ohmi et al. .................. | 372/57 |
| 5,936,988 A | 8/1999 | Partlo et al. .................. | 372/38 |
| 5,940,421 A | 8/1999 | Partlo et al. .................. | 372/38 |
| 5,946,337 A | 8/1999 | Govorvok et al. ............ | 372/92 |
| 5,946,988 A | 8/1999 | Partlo et al. .................. | 372/38 |
| 5,949,806 A | 9/1999 | Ness et al. .................... | 372/38 |
| 5,970,082 A | 10/1999 | Ershov ....................... | 372/102 |
| 5,978,391 A | 11/1999 | Das et al. ..................... | 372/20 |
| 5,978,394 A | 11/1999 | Newman et al. .............. | 372/32 |
| 5,978,405 A | 11/1999 | Juhasz et al. ................. | 372/57 |
| 5,978,406 A | 11/1999 | Rokni et al. .................. | 372/58 |
| 5,978,409 A | 11/1999 | Das et al. .................... | 372/100 |
| 5,982,795 A | 11/1999 | Rothweil et al. ............. | 372/38 |
| 5,982,800 A | 11/1999 | Ishihara et al. ............... | 372/57 |
| 5,991,324 A | 11/1999 | Knowles et al. .............. | 372/57 |
| 5,999,318 A | 12/1999 | Morton et al. .............. | 359/572 |
| 6,005,880 A | 12/1999 | Basting et al. ................ | 372/38 |
| 6,014,398 A | 1/2000 | Hofmann et al. ............ | 372/60 |
| 6,015,206 A | 1/2000 | Basting et al. .............. | 356/138 |
| 6,020,723 A | 2/2000 | Desor et al. ................ | 320/166 |
| 6,028,872 A | 2/2000 | Partlo et al. .................. | 372/38 |
| 6,028,880 A | 2/2000 | Carlesi et al. ................ | 372/58 |
| 6,061,382 A | 5/2000 | Govorkov et al. .......... | 372/101 |
| 6,097,311 A | 5/2000 | Morton et al. ................ | 372/57 |
| 6,128,323 A * | 10/2000 | Meyers et al. ................ | 372/38 |
| 6,151,346 A | 11/2000 | Partlo et al. .................. | 372/38 |
| 6,154,470 A * | 11/2000 | Basting et al. ................ | 372/19 |
| 6,163,559 A * | 12/2000 | Watson ....................... | 372/102 |
| 6,282,221 B1 * | 8/2001 | Ohmi et al. .................. | 372/57 |

OTHER PUBLICATIONS

T. Efthimiopoulos, et al., "An Auto–pre–pulse and Pre–Ionization Long–Pulse XeCl Laser," *Journal of Physics E. Scientific Instruments*, vol. 6, 1995, No. 2, pp. 167–169.

Melville, W.S., "The Use of Saturable Reactors as Discharge Devices for Pulse Generators," *The Proceedings of The Institution of Electrical Engineers Part III*, vol. 98, 1951, pp. 185–206.

T.Y. Chang, "Improved Uniform–Field Electrode Profiles for TEA Laser and High Voltage Applications," *The Review of Scientific Instruments*, Apr. 1973, vol. 4., No. 4., pp. 405–407.

Birx, et al., "Regulation and Drive System for High Rep–Rate Magnetic Pulse Compressors," Article prepared for submission to the $15^{th}$ Power Modulator Symposium, Baltimore, Maryland, Jun. 14–16, 1982, pp. 1–17.

Smilanski, I., et al., "Electrical Excitation of an XeCl Laser Using Magnetic Pulse Compression," *Appl. Phys. Lett.*, Vol. 40, No. 7, Apr. 1, 1982, pp. 547–548.

E.A. Stappaerts, "A Novel Analytical Design Method for Discharge Laser Electrode Profiles," *Appl. Phys.Lett.*, Jun. 15, 1982, vol. 40., No. 12., p. 1018–1019.

Soldatov, et al., "Copper Vapor Laser with Stabilized Output Parameters," *Sov. J. Quantum Electron.*, vol. 13, No. 5, May 1983, pp. 612–616.

Ernst G.J. et al., "Compact Uniform Field Electrode Profile," *Optics Communications* vol. 47, No. 1, Aug. 1, 1983, pp. 47–51.

G.J. Ernst, "Uniform–Field Electrodes with Minimum Width, " *Optics Communications* vol. 49, No. 4, Mar. 15, 1984, pp. 275–277.

Marchetti et al., "A New Type of Corona–Discharge Photoionization Source for Gas Lasers," *J. Appl. Phys.* vol. 56, No.11, Dec. 1984, pp. 3163–3168.

T. Shimada et al., "Semiconductor Switched Magnetic Modulator for Rep–Rate Lasers," *IEEE Pulse Conference*, Crystal City, Virginia, Jun. 10–12, 1985, 4 pages in length.

Shimada, et al., "An All Solid–State Magnetic Switching Exciter for Pumping Excimer Lasers," *Rev. Sci. Instrum.*, vol. 56, No. 11, 1985, 3 pages.

Kobayashi, et al., "High Power Repetitive Excimer Lasers Pumped by an All Solid State Magnetic Exciter," *SPIE*, vol. 622, 1986, pp. 111–117.

Baker, H.J., et al., Magnetic Switching Circuits for Variable High Voltage Pulse Delays and Gas–Laser Synchronisation, *The Institute of Physics*, 1986, pp. 149–152.

Bakert, H.J., et al., "An Efficient Laser Pulser Using Ferrite Magnetic Switches," *IOP Publishing*, 1988, pp. 218–224.

Keet, A.L., et al., "High Voltage Solid State Pulser for High Repetition–Rate Gas Lasers," *EPE Aochen*, 1989, 4 pages.

Greenwood, et al., "An Optimisation Strategy for Efficient Pulse Compression," *IEEE*, Sep. 1990, 9pp. 187–191.

Dr. D. Basting, "Industrial Excimer Lasers," $2^{nd}$ Edition, 1991.

Von Bergmann, et al., "Thyristor–driven Pulsers for Multikilowatt Average Power Lasers," *IEE Proceedings–B*, vol. 139, No. 2, Mar. 1992, pp. 123–130.

Druckmann, et al., "A New Algorithm for the Design of Magnetic Pulse Compressors," *IEEE*, Jul. 1992, 99. 213–216.

Handbook of Transformer Design and Applications, by William M. Flanagan, $2^{nd}$ Edition, 1993: Chapter 10: Design Procedures, pp. 10.1–10.28.

Taylor, R.S., et al., "Pre–Ionization of a Long Optical Pulse Magnetic–Spiker Systainer XeCl Laser," *Rev. Sci. Instrum.* vol. 65, No. 12, Dec. 1994, pp. 3621–3627.

V.M. Borisov et al., "Effects Limiting the Average Power of Compact Pulse–periodic KrF Lasers," *Quantum Electronics*, 1995, vol. 25., No. 5., pp. 421–425.

Enami et al., "High Spectral Pourity and High Durability kHz KrF Excimer Laser with Advanced RF Pre–Ionization Discharge," *Proceedings of SPIE*, vol. 3334, Feb. 25–27, 1998, pp. 1031–1040.

Book by Grove entitled: Introducing Calculations. Chapter 5: Parallel Elements of Equal Length, pp. 31–43.

* cited by examiner

EXCIMER OR MOLECULAR LASER WITH OPTIMIZED SPECTRAL PURITY

PRIORITY

This application claims the benefit of priority to U.S. Provisional Application No. 60/149,392, filed Aug. 17, 1999, which is hereby incorporated by reference.

BACKGROUND OF THE INVENTION

1. Field of the Invention

The invention relates to narrow band output excimer and molecular fluorine laser systems and particularly to a pulse compression circuit configuration for reducing effects of amplified spontaneous emission and thereby improving spectral purity in the output beam.

2. Discussion of the Related Art

In a conventional excimer laser excitation circuit having a solid state pulse generator, the circuit components are typically configured to minimize the risetime of the charge and maximize the discharge speed of final pulse compression stage capacitors, or peaking capacitors, connected to discharge electrodes in the laser chamber. In this way, it is thought that an efficient gain may be achieved.

FIG. 1 schematically shows a portion of a conventional excimer laser discharge circuit arrangement. A pair of main electrodes 32a, 32b separated by a discharge area or volume 34 filled with a portion of a gas mixture that generally fills the laser discharge chamber (not shown). A pair of preionizers 36 are also shown. An electrical pulse is delivered to the electrodes 32a, 32b, 36 from the discharge circuit of which only one of several final stage capacitors, or peaking capacitors 38, of a pulse compression circuit are shown. Each of the peaking capacitors 38 has a capacitance $C_p$ and is connected to the main electrodes 32 through an inductance $L_p$. Since it is typically desired to keep the inductance $L_p$ as small as possible in accordance with the goals of fast charge risetime and fast discharge of the peaking capacitors 38, the peaking capacitors 38 are typically located as close as possible to the high voltage main electrode 32a.

FIG. 2 illustrates exemplary waveforms achieved using the arrangement of FIG. 1, i.e., an arrangement wherein the peaking capacitors 38 are each arranged close as practical to the high voltage main discharge electrode 32a to minimize the inductance $L_p$ between the peaking capacitors 38 and the main electrode 32a. Three plots are shown. The first labeled plot 1 is the waveform of the electrical pulse delivered to the main electrode 32a. The second labeled plot 2 is the waveform of the light pulse emitted from the laser resonator. The third labeled plot 3 is the waveform of the amplified spontaneous emission (ASE) emanating from the discharge volume. It is noted here that the amplitudes of the traces shown at FIG. 2 are not comparable because different signals were used.

RECOGNIZED IN THE INVENTION

The fast risetime of the excitation circuit of FIG. 1 (see FIG. 2, plot 1) leads to a fast rise of the gain which is on the order of nanoseconds (ns) or up to several tens of ns. This fast electrical pumping determines the rise of the emitted optical pulse (see FIG. 2, plot 2) in the line narrowed laser. It is recognized in the invention that the ASE is not line-narrowed and gives rise to a broadband background within the otherwise line-narrowed emission of the laser. It is moreover recognized in the invention that the gain of the laser becomes saturated by photons generated at the leading edge of the electrical pulse, and that the ASE is typically mainly emitted at the leading edge of the pulse.

After the first half round trip, e.g., after 5–15 ns, photon generation within the discharge chamber becomes predominantly stimulated emission, rather than spontaneous emission, due to its far greater cross section and the arrival of large numbers of reflected photons, which either have been or will be subject to line-narrowing before outcoupling from the resonator, unlike ASE photons. Thus, the spectral purity of the line-narrowed laser beam may generally be limited by the intensity of broadband background ASE generated at the leading edge of the electrical pulse.

It is thus an object of the invention to reduce the proportion of the ASE within the laser pulse in order to achieve greater spectral purity in the emitted line-narrowed beam.

SUMMARY OF THE INVENTION

In accordance with the above, an illumination photolithography system for producing structures on a workpiece includes an excimer or molecular fluorine laser system for delivering an output emission from the laser system to the imaging system and/or workpiece. The laser system includes a discharge chamber filled with a laser gas mixture, multiple electrodes including a pair of main electrodes separated by a discharge volume within the discharge chamber and connected to a pulsed discharge circuit for energizing the gas mixture within the discharge volume, and a resonator including the discharge chamber for generating an output laser beam.

The pulsed discharge circuit includes a high voltage power supply, a main storage capacitor which is charged by the power supply, a pulse compression circuit and a switch for permitting the storage capacitor to discharge through the pulse compression circuit to the electrodes. The pulse compression circuit includes a series of pulse compression stages each having a stage capacitance and being separated by a stage inductance.

A final stage capacitance is provided by a set of peaking capacitors connected through a first inductance to the electrodes and a set of sustaining capacitors connected to the electrodes through a second inductance substantially greater than the first inductance. The current pulses through the discharge are temporally extended relative to current pulses of a system having its final stage capacitance provided only by a set of peaking capacitors connected to the electrodes via a lower inductance. An amplified spontaneous emission (ASE) level in the laser output pulses is thereby reduced and the spectral purity is enhanced.

The additional inductance is preferably sufficient to reduce the broadband background ASE to less than 0.5%. The additional inductance is preferably more than 50% of the original inductance. The sustaining capacitors also preferably provide more than half of the overall capacitance of the final stage capacitors.

INCORPORATION BY REFERENCE

Figure 1:
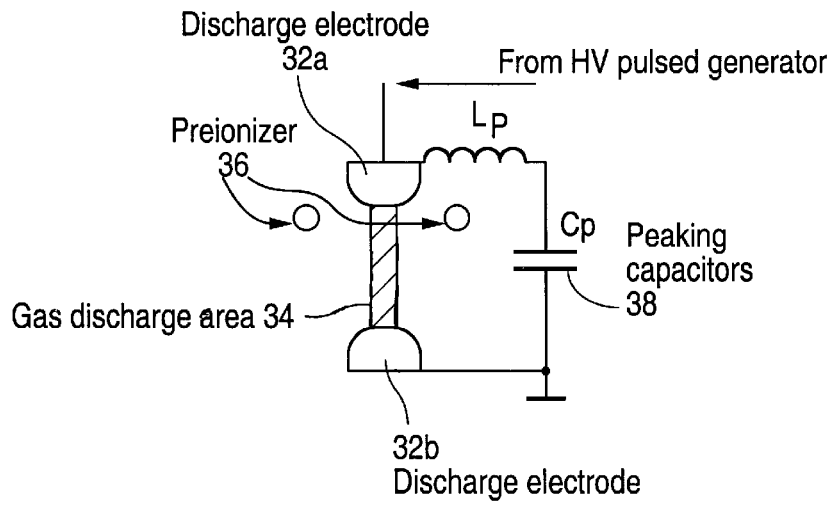
FIG. 1 schematically illustrates a portion of a conventional discharge circuit of an excimer laser connected to discharge electrodes within a laser chamber.

What follows is a cite list of references each of which is, in addition to those references cited above in the priority section, hereby incorporated by reference into the detailed description of the preferred embodiment below, as disclosing alternative embodiments of elements or features of the preferred embodiments not otherwise set forth in detail below. A single one or a combination of two or more of these references may be consulted to obtain a variation of the preferred embodiments described in the detailed description below. Further patent, patent application and non-patent references are cited in the written description and are also incorporated by reference into the preferred embodiment with the same effect as just described with respect to the following references:

U.S. patent applications Ser. Nos. 09/317,527, 09/343,333, 09/453,670, 09/447,882, 09/317,695, 09/574,921, 09/559,130, 60/122,145, 60/140,531, 60/140,530, 60/162,735, 60/166,952, 60/171,172, 09/453,670, 60/184,705, 60/128, 227, 09/1584,420, 60/141,678, 60/1173,993, 60/166,967, 60/172,674, 60/162,845, 60/160,182, 60/127,237, 09/535, 276, 09/247,887, 60/181,156, 60/149,392, 60/198,058, 09/390,146, 09/131,580, 09/432,348, 60/204,095, 09/172, 805, 60/172,749, 60/166,952, 60/178,620, 09/416,344, 60/186,003, 60/158,808, 09/484,818, 09/317,526, 60/124, 785, 09/418,052, 09/379,034, 60/171,717, 60/159,525, 09/513,025, 09/532,276, 60/160,126, 09/418,052, 09/550, 558 and 60/186,096, and U.S. Pat. Nos. 6,005,880, 6,014, 206, 4,393,405, 4,977,573, 4,905,243, 5,729,565, 4,860, 300, 6,020,723, 5,140,600 and 5,396,514, each of which is assigned to the same assignee as the present application;

U.S. Pat. Nos. 5,313,481, 4,718,072, 4,142,166, 5,319,665, 5,729,562, 5,710,787, 5,463,650, 4,916,707, 5,940,421, 5,936,988, 5,914,974, 5,949,806, 5,982,795, 6,016,325, 6,067,311, and 6,028,872;

WO 96/25778, DE 38 42 492; and

R. S. Taylor and K. E. Leopold, "Magnetic Spiker Excitation of Gas Discharge Lasers, Appl. Phys. B 59, 479–508 (1994);

I. Druckman et al., "A New Algorithm for the Design of Magnetic Pulse Compressors," IEEE Single Copy Sales, 1992 Twentieth Power Modulator Symposium, 1992, pp. 213–216, 1992;

M. Greenwood et al., "An Optimisation Strategy for Efficient Pulse Compression," IEEE Conference Record of the 1990 Nineteenth Power Modulator Symposium, 1990, pp. 187–191, 1990;

I. Smilanski et al., "Electrical excitation of an XeCI laser using magnetic pulse compression, Appl. Phys. Lett., Vol. 40, No. 7, Apr. 1, 1982, pp. 547–548;

O. Kobayashi et al., "High power repetitive excimer lasers pumped by an all solid state magnetic exciter," SPIE Vol. 622, High Power and Solid State Lasers, 1986, pp. 111–117;

A. L. Keet et al., "High voltage solid-state pulser for high repetition-rate gas lasers," EPE Aachen, 1989, 4 pages in length;

H. M. Von Bergmann, "Thyristor-driven pulsers for multi-kilowatt average power lasers," IEE Proceedings-B, Vol. 139, No. 2, 1992, pp. 123–130;

Questek, "Magnetic pulse compression for excimer lasers," Technical Note No. 2, May 1983, 3 pages in length;

T. Shimada et al., "An all solid-state megnetic switching exciter for pumping excimer lasers," Rev. of Sci. Instrum., Vol. 56, No. 11, 1985, 3 pages in length;

T. Shimada et al., "Semiconductor switched magnetic modulator for rep-rate lasers," IEEE Pulse Conference, Crystal City, Va., Jun. 10–12 1985, 4 pages in length;

H. J. Baker et al., "An efficient laser pulser using ferrite magnetic switches," published by IOP Publishing Ltd., 1988, pp. 218–224;

W. M. Flanagan, Handbook of Transformer Design and Applications, 2nd Edition, copyright 1993, 1986 by McGraw Hill, pp. 10.1–10.29;

F. W. Grover, Inductance Calculations, Chapter 5, entitled: "Parallel Elements of Equal Length," New York, 1945, pp. 31–44, 1946;

W. S. Melville, "The Use of Saturable Reactors as Discharge Devices for Pulse Generators," The Proceedings of the Institution of Electrical Engineers, Part III Radio and Communication Engineering, London, England, Vol. 98, p.185;

D. L. Birx et al., "Regulation and Drive System for High Rep-Rate Magnetic Pulse Compressors", Proceedings 15th Power Modulator Symposium in Baltimore, Md., Jun. 14–16 1992, pp. 15–21;

D. Basting et al., "Thyratrons with magnetic Switches: The Key to Reliable Excimer Lasers", Laser und Optoelektronik, No. 2, 1984, pp. 128 131; and H. J. Baker et al., "Magnetic switching circuits for variable high voltage pulse delays and gas-laser synchronisation", J. Phys. E:Sci. Instrum, No. 19, 1986, pp. 149–152.

DETAILED DESCRIPTION OF THE PREFERRED EMBODIMENT

Figure 3:
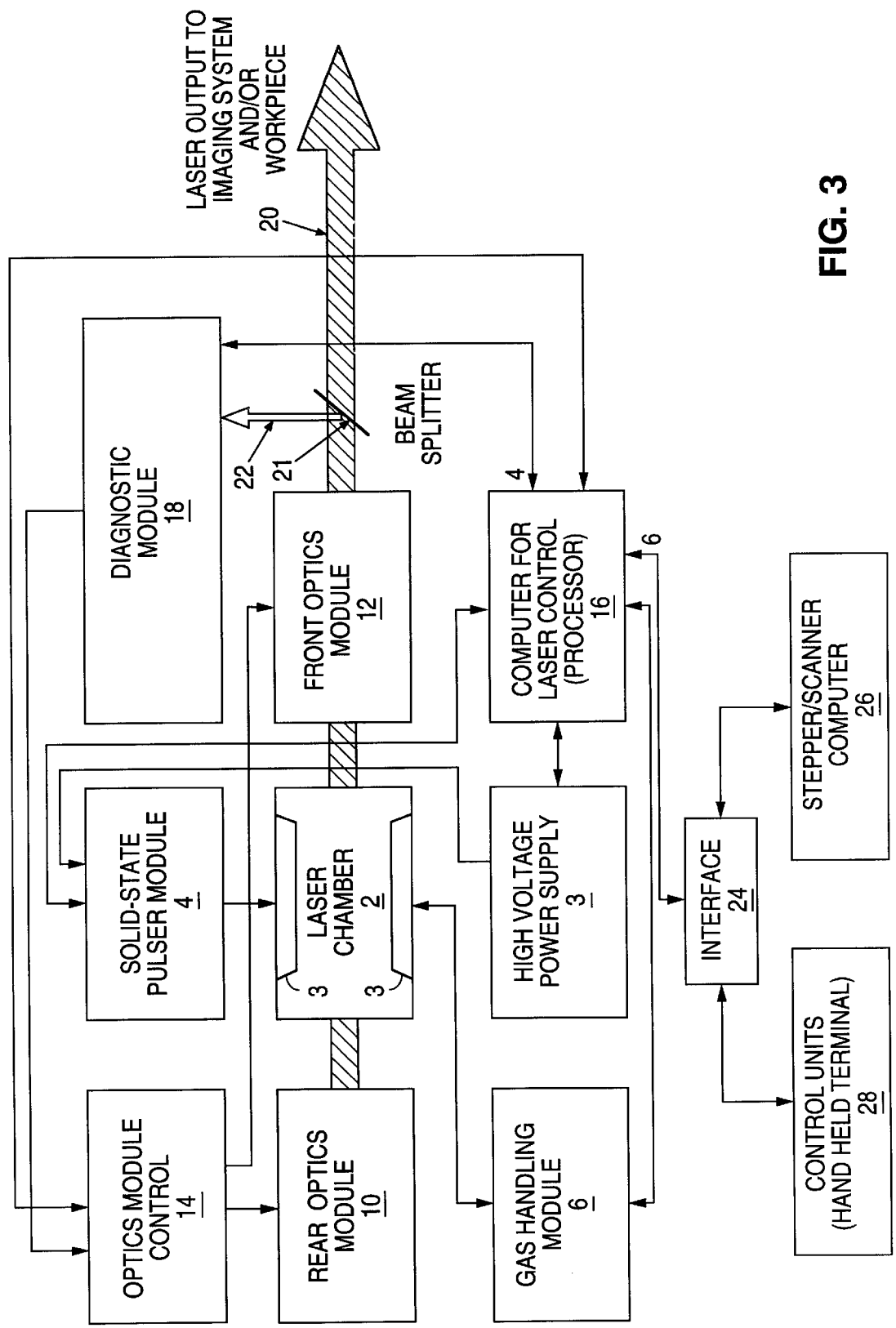
FIG. 3 schematically shows an excimer or molecular fluorine laser system in accord with a preferred embodiment.

Referring to FIG. 3, a DUV or VUV laser system, preferably an excimer, such as ArF or KrF, or molecular fluorine ($F_2$) laser system for deep ultraviolet (DUV) or vacuum ultraviolet (VUV) lithography, is schematically shown. Alternative configurations for laser systems for use in such other industrial applications as TFT annealing and/or micromachining, e.g., are understood by one skilled in the art as being similar to and/or modified from the system shown in FIG. 3 to meet the requirements of that application. For this purpose, alternative DUV or VUV laser system and component configurations are described at U.S. patent applications Ser. Nos. 09/317,695, 09/317,526, 09/130,277, 09/244,554, 09/452,353, 09/317,527, 09/343,333, 60/122, 145, 60/140,531, 60/162,735, 60/166,952, 60/171,172, 60/141,678, 60/173,993, 60/166,967, 60/147,219, 60/170, 342, 60/162,735, 60/178,445, 60/166,277, 60/167,835, 60/171,919, 60/202,564, 60/204,095, 60/172,674, 09/574, 921 and 60/181,156, and U.S. Pat. Nos. 6,005,880, 6,061, 382, 6,020,723, 5,946,337, 6,014,206, 5,559,816, 4,611,270, 5,761,236, each of which is assigned to the same assignee as the present application and is hereby incorporated by reference.

The system shown in FIG. 3 generally includes a laser chamber 2 having a pair of main discharge electrodes 3 connected with a solid-state pulser module 4, and a gas handling module 6. The solid-state pulser module 4 is powered by a high voltage power supply 8. The laser chamber 2 is surrounded by optics module 10 and optics module 12, forming a resonator. The optics modules 10 and 12 are controlled by an optics control module 14, or may be alternatively directly controlled by a computer 16.

The computer 16 for laser control receives various inputs and controls various operating parameters of the system. A diagnostic module 18 receives and measures one or more parameters of a split off portion of the main beam 20 via optics for deflecting a small portion of the beam toward the module 18, such as preferably a beam splitter module 22, as shown. The beam 20 is preferably the laser output to an imaging system (not shown) and ultimately to a workpiece (also not shown), and may be output directly to an application process. The laser control computer 16 communicates through an interface 24 with a stepper/scanner computer 26 and other control units 28.

The laser chamber 2 contains a laser gas mixture and includes one or more preionization electrodes (not shown) in addition to the pair of main discharge electrodes 3. Preferred main electrodes 3 are described at U.S. patent applications Ser. Nos. 09/453,670, 60/184,705 and 60/128,227, each of which is assigned to the same assignee as the present application and is hereby incorporated by reference. Other electrode configurations are set forth at U.S. Pat Nos. 5,729,565 and 4,860,300, each of which is assigned to the same assignee, and alternative embodiments are set forth at U.S. Pat Nos. 4,691,322, 5,535,233 and 5,557,629, all of which are hereby incorporated by reference. Preferred preionization units are set forth at U.S. patent applications Ser. No. 60/162,845, 60/160,182, 60/127,237, 09/535,276 and 09/247,887, each of which is assigned to the same assignee as the present application, and alternative embodiments are set forth at U.S. Pat. Nos. 5,337,330, 5,818,865 and 5,991,324, all of the above patents and patent applications being hereby incorporated by reference.

The solid-state pulser module 14 and high voltage power supply 8 supply electrical energy in compressed electrical pulses to the preionization and main electrodes 3 within the laser chamber 2 to energize the gas mixture. Components of the preferred pulser module and high voltage power supply may be described at U.S. patent applications Ser. Nos. 60/149,392, 60/198,058, 60/204,095, 09/432,348 and 09/390,146, and 60/204,095, and U.S. Pat. Nos. 6,005,880 and 6,020,723, each of which is assigned to the same assignee as the present application and which is hereby incorporated by reference into the present application. Other alternative pulser modules are described at U.S. Pat. Nos. 5,982,800, 5,982,795, 5,940,421, 5,914,974, 5,949,806, 5,936,988, 6,028,872 and 5,729,562, each of which is hereby incorporated by reference. A conventional pulser module may generate electrical pulses in excess of 3 Joules of electrical power (see the '988 patent, mentioned above). Other features and aspects of the preferred pulser module are set forth below, with reference to FIGS. 4–5.

The laser resonator which surrounds the laser chamber 2 containing the laser gas mixture includes optics module 10 including line-narrowing optics for a line narrowed excimer or molecular fluorine laser, which may be replaced by a high reflectivity mirror or the like in a laser system wherein either line-narrowing is not desired, or if line narrowing is performed at the front optics module 12, or a spectral filter external to the resonator is used, or if the line-narrowing optics are disposed in front of the HR mirror, for narrowing the linewidth of the output beam.

The laser chamber 2 is sealed by windows transparent to the wavelengths of the emitted laser radiation 14. The windows may be Brewster windows or may be aligned at another angle, e.g., 5°, to the optical path of the resonating beam. One of the windows may also serve to output couple the beam.

After a portion of the output beam 20 passes the outcoupler of the optics module 12, that output portion impinges upon beam splitter module 22 which includes optics for deflecting a portion of the beam to the diagnostic module 18, or otherwise allowing a small portion of the outcoupled beam to reach the diagnostic module 18, while a main beam portion 20 is allowed to continue as the output beam 20 of the laser system. Preferred optics include a beamsplitter or otherwise partially reflecting surface optic. The optics may also include a mirror or beam splitter as a second reflecting optic. More than one beam splitter and/or HR mirror(s), and/or dichroic mirror(s) may be used to direct portions of the beam to components of the diagnostic module 18. A holographic beam sampler, transmission grating, partially transmissive reflection diffraction grating, grism, prism or other refractive, dispersive and/or transmissive optic or optics may also be used to separate a small beam portion from the main beam 20 for detection at the diagnostic module 18, while allowing most of the main beam 20 to reach an application process directly or via an imaging system or otherwise.

The output beam 20 may be transmitted at the beam splitter module 21 while a reflected beam portion is directed at the diagnostic module 18, or the main beam 20 may be reflected, while a small portion is transmitted to the diagnostic module 18. The portion of the outcoupled beam which continues past the beam splitter module 21 is the output beam 20 of the laser, which propagates toward an industrial or experimental application such as an imaging system and workpiece for photolithographic applications. Variations of beam splitter modules particularly for a molecular fluorine laser system are set forth at U.S. patent application Ser. Nos. 09/598,552 and 60/140,530, which are each assigned to the same assignee and are hereby incorporated by reference.

Also particularly for the molecular fluorine laser system, and for the ArF laser system, an enclosure (not shown) may seal the beam path of the beam 20 such as to keep the beam path free of photoabsorbing species. Smaller enclosures may seal the beam path between the chamber 2 and the optics modules 10 and 12 and between the beam splitter 22 and the diagnostic module. The preferred enclosure is described in detail in the Ser. Nos. 09/343,333, 09/598,552, 09/594,892, 09/131,580 and 60/140,530 applications, each of which is assigned to the same assignee and is hereby incorporated by reference, and U.S. Pat. Nos. 5,559,584, 5,221,823, 5,763, 855, 5,811,753 and 4,616,908, all of which are hereby incorporated by reference.

The diagnostic module 18 preferably includes at least one energy detector. This detector measures the total energy of the beam portion that corresponds directly to the energy of the output beam 20 ( see U.S. Pat. No. 4,611,270 and U.S. patent application Ser. No. 09/379,034, each of which is assigned to the same assignee and is hereby incorporated by reference. An optical configuration such as an optical attenuator, e.g., a plate or a coating, or other optics may be formed on or near the detector or beam splitter module 21 to control the intensity, spectral distribution and/or other parameters of the radiation impinging upon the detector (see U.S. patent applications Ser. Nos. 09/172,805, 60/172,749, 60/166,952 and 60/178,620, each of which is assigned to the same assignee as the present application and is hereby incorporated by reference).

One other component of the diagnostic module 18 is preferably a wavelength and/or bandwidth detection component such as a monitor etalon or grating spectrometer (see U.S. patent applications Ser. Nos. 09/416,344, 60/186,003, 60/158,808, 60/186,096, 60/186,096 and 60/186,096 and Lokai, et al., serial number not yet assigned, "Absolute Wavelength Calibration of Lithography Laser Using Multiple Element or Tandem See Through Hollow Cathode Lamp", filed May 10, 2000, each of which is assigned to the same assignee as the present application, and U.S. Pat. Nos. 4,905,243, 5,978,391, 5,450,207, 4,926,428, 5,748,346, 5,025,445, and 5,978,394, all of the above wavelength and/or bandwidth detection and monitoring components being hereby incorporated by reference.

Other components of the diagnostic module may include a pulse shape detector or ASE detector, such as are described at U.S. patent application Ser. Nos. 09/484,818 and 09/418,052, respectively, each of which is assigned to the same assignee as the present application and is hereby incorporated by reference, such as for gas control and/or output beam energy stabilization, or to monitor the amount of amplified spontaneous emission (ASE) within the beam to ensure that the ASE remains below a predetermined level, as set forth in more detail below. There may be a beam alignment monitor, e.g., such as is described at U.S. Pat. No. 6,014,206 which is assigned to the same assignee and is hereby incorporated by reference.

The processor or control computer 16 receives and processes values of some of the pulse shape, energy, ASE, energy stability, energy overshoot for burst mode operation, wavelength, spectral purity and/or bandwidth, among other input or output parameters of the laser system and output beam. The processor 16 also controls the line narrowing module to tune the wavelength and/or bandwidth or spectral purity, and controls the power supply and pulser module 4 and 8 to control preferably the moving average pulse power or-energy, such that the energy dose at points on the workpiece is stabilized around a desired value. In addition, the computer 16 controls the gas handling module 6 which includes gas supply valves connected to various gas sources.

The laser gas mixture is initially filled into the laser chamber 2 during new fills. The gas composition for a very stable excimer or molecular fluorine laser in accord with the preferred embodiment uses helium or neon or a mixture of helium and neon as buffer gas(es), depending on the particular laser being used. Preferred gas compositions are described at U.S. Pat. Nos. 4,393,405 and 4,977,573 and U.S. patent application Ser. Nos. 09/317,526, 09/513,025, 60/124,785, 09/418,052, 60/159,525 and 60/160,126, each of which is assigned to the same assignee and is hereby incorporated by reference into the present application. The concentration of the fluorine in the gas mixture may range from 0.003% to 1.00%, and is preferably around 0.1%. An additional gas additive, such as a rare gas, may be added for increased energy stability and/or as an attenuator as described in the 09/513,025 application incorporated by reference above. Specifically, for the F2-laser, an addition of xenon and/or argon may be used. The concentration of xenon or argon in the mixture may range from 0.0001% to 0.1%. For an ArF-laser, an addition of xenon or krypton may be used also having a concentration between 0.0001% to 0.1%. For the KrF laser, an addition of xenon or argon may be used also having a concentration between 0.0001% to 0.1%.

Halogen and rare gas injections, total pressure adjustments and gas replacement procedures are performed using the gas handling module 6 preferably including a vacuum pump, a valve network and one or more gas compartments. The gas handling module 6 receives gas via gas lines connected to gas containers, tanks, canisters and/or bottles. Preferred gas handling and/or replenishment procedures of the preferred embodiment, other than as specifically described herein, are described at U.S. Pat. Nos. 4,977,573 and 5,396,514 and U.S. patent application Ser. Nos. 60/124, 785, 09/418,052, 09/379,034, 60/171,717, and 60/1 59,525, each of which is assigned to the same assignee as the present application, and U.S. Pat. Nos. 5,978,406, 6,014,398 and 6,028,880, all of which are hereby incorporated by reference. A xenon gas supply may be included either internal or external to the laser system according to the '025 application, mentioned above.

A general description of the line-narrowing features of the several embodiments of the present is provided here, followed by a listing of patent and patent applications being incorporated by reference as describing variations and features that may used within the scope of the present invention for providing an output beam with a high spectral purity or bandwidth (e.g., below 1 pm). Exemplary line-narrowing optics contained in the optics module 10 include a beam expander, an optional etalon and a diffraction grating, which produces a relatively high degree of dispersion, for a narrow band laser such as is used with a refractive or catadioptric optical lithography imaging system. As mentioned above, the front optics module may include line-narrowing optics as well (see the Ser. Nos. 60/166,277, 60/173,993 and 60/166,967 applications, each being assigned to the same assignee and hereby incorporated by reference). For a semi-narrow band laser such as is used with an all-reflective imaging system, the grating may be replaced with a highly reflective mirror, and a lower degree of dispersion may be produced by a dispersive prism. A semi-narrow band laser would typically have an output beam linewidth in excess of 1 pm and may be as high as 100 pm in some laser systems, depending on the characteristic broadband bandwidth of the laser.

The beam expander of the above exemplary line-narrowing optics of the optics module 10 preferably includes one or more prisms. The beam expander may include other beam expanding optics such as a lens assembly or a converging/diverging lens pair. The grating or a highly reflective mirror is preferably rotatable so that the wavelengths reflected into the acceptance angle of the resonator can be selected or tuned. Alternatively, the grating, or other optic or optics, or the entire line-narrowing module may be pressure tuned, such as is set forth in the Ser. Nos. 60/178, 445 and 09/317,527 applications, each of which is assigned to the same assignee and is hereby incorporated by reference. The grating may be used both for dispersing the beam for achieving narrow bandwidths and also preferably for retroreflecting the beam back toward the laser tube. Alternatively, a highly reflective mirror is positioned after the grating which receives a reflection from the grating and reflects the beam back toward the grating in a Littman configuration, or the grating may be a transmission grating. One or more dispersive prisms may also be used, and more than one etalon may be used.

Depending on the type and extent of line-narrowing and/or selection and tuning that is desired, and the particular laser that the line-narrowing optics are to be installed into, there are many alternative optical configurations that may be used. For this purpose, those shown in U.S. Pat. Nos. 4,399,540, 4,905,243, 5,226,050, 5,559,816, 5,659,419, 5,663,973, 5,761,236, and 5,946,337, and U.S. patent application Ser. Nos. 09/317,695, 09/130,277, 09/244,554, 09/317,527, 09/073,070, 60/124,241, 60/140,532, 60/147, 219 and 60/140,531 60/147,219, 60/170,342, 60/172,749, 60/178,620, 60/173,993, 60/166,277, 60/166,967, 60/167, 835, 60/170,919, 60/186,096, each of which is assigned to the same assignee as the present application, and U.S. Pat. Nos. 5,095,492, 5,684,822, 5,835,520, 5,852,627, 5,856, 991, 5,898,725, 5,901,163, 5,917,849, 5,970,082, 5,404,366, 4,975,919, 5,142,543, 5,596,596, 5,802,094, 4,856,018, 5,970,082, 5,978,409, 5,999,318, 5,150,370 and 4,829,536, and German patent DE 298 22 090.3, are each hereby incorporated by reference into the present application.

Optics module 12 preferably includes means for outcoupling the beam 20, such as a partially reflective resonator reflector. The beam 20 may be otherwise outcoupled such as by an intra-resonator beam splitter or partially reflecting surface of another optical element, and the optics module 12 would in this case include a highly reflective mirror. The optics control module 14 preferably controls the optics modules 10 and 12 such as by receiving and interpreting signals from the processor 16, and initiating realignment or reconfiguration procedures (see the '241, '695, 277, 554, and 527 applications mentioned above). The invention relates to narrow bandwidth excimer lasers for the use in lithography. It is valid for excimer lasers with narrow bandwidth resonators (248 nm excimer laser, 193 run excimer laser), as well as F2 lasers (157 nm) with the line-selection and/or additional line narrowing packages.

Figure 4A:
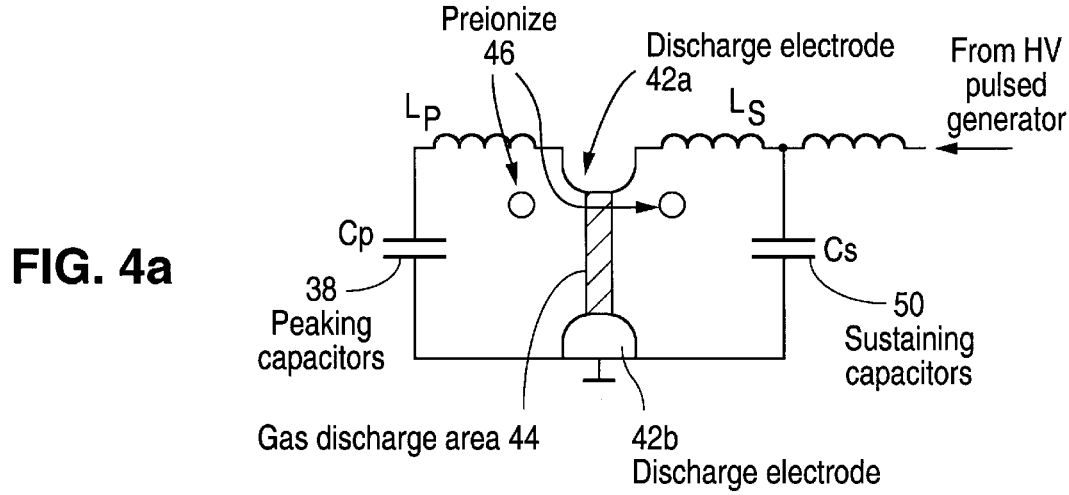
FIG. 4a schematically illustrates a portion of a discharge circuit of an excimer or molecular fluorine laser according to a first variation of the preferred embodiment.
Figure 4B:
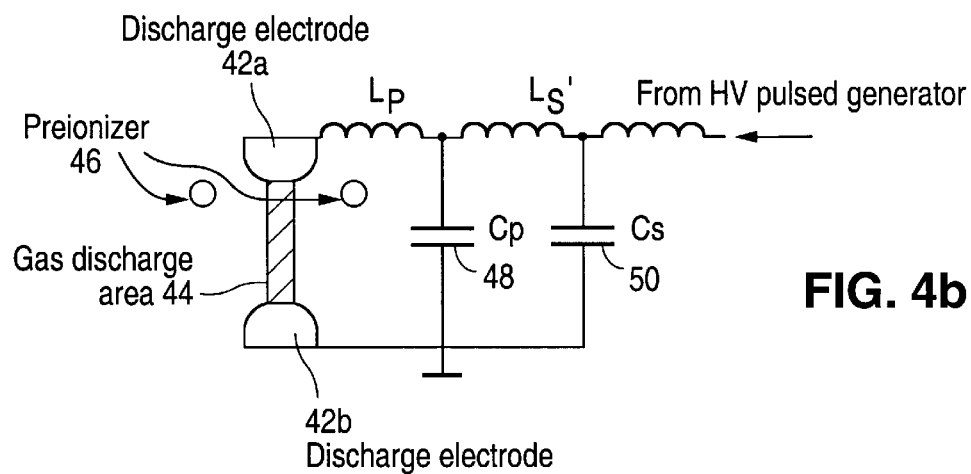
FIG. 4b schematically illustrates a portion of a discharge circuit of an excimer or molecular fluorine laser according to a second variation of the preferred embodiment.

Referring now to FIGS. 4a and 4b, a portion of the pulser module 4 of FIG. 3 is shown schematically in accord with the preferred embodiment. A pair of main discharge electrodes 42a, 42b are shown in FIG. 4a separated by a discharge area or discharge volume 44. A pair of preionizers 46 are also shown, and alternatively only a single preionizer unit 46 may be used.

The final stage capacitors of the pulse compression unit of the pulser module 4 of FIG. 3 are shown as peaking capacitors 48 and sustaining capacitors 50. The peaking capacitors 48 are connected to the high voltage electrode 42a through an inductance $L_p$. The sustaining capacitors $C_s$ are connected to the high voltage electrode 42a though inductances $L_s$. The inductances Ls are greater than the inductances $L_p$. The peaking capacitors 48 are connected on the opposite side of the main electrode 42a as the sustaining capacitors 50 in the embodiment shown at FIG. 4a.

The final stage capacitors of the pulse compression circuit portion shown at FIG. 4b are arranged somewhat differently than those of FIG. 4a. The peaking capacitors 48 are connected to the main electrode 42a through an inductance $L_p$, which may be the same or different than the inductance $L_p$ through which the peaking capacitors 48 of the embodiment of FIG. 4a are connected to the main electrode 42a. The sustaining capacitors 50 of FIG. 4b are connected to the main electrode 42a through the inductance $L_p$ and an additional inductance $L_s'$. The total inductance through which the sustaining capacitors 50 are connected to the main electrode 42a is thus $L_p+L_s$ 40, which may be the same or different than the inductance Ls through which the sustaining capacitors 50 of the embodiment of FIG. 4a are connected to the main electrode 42a. The inductance $L_p+L_s'$ is clearly greater than the inductance $L_p$ in this embodiment.

The final stage capacitors of the preferred embodiments of FIGS. 4a and 4b differ from the conventional final stage capacitors shown at FIG. 1. As shown and described earlier with respect to FIG. 1, all of the final stage capacitors 38 are connected to the main electrode 32a through a same inductance $L_p$ which is typically made to be as small as practical. In contrast, some of the final stage capacitors, i.e., the peaking capacitors 48, of the preferred embodiments of FIGS. 4a and 4b are connected to the main electrode 42a through a first inductance $L_p$, which is preferably as small as practical, while others of the final stage capacitors, i.e., the sustaining capacitors 50, of FIGS. 4a and 4b are connected to the main electrode 42b through a different, larger inductance $L_s$ or $L_p+L_s'$.

Figure 2:
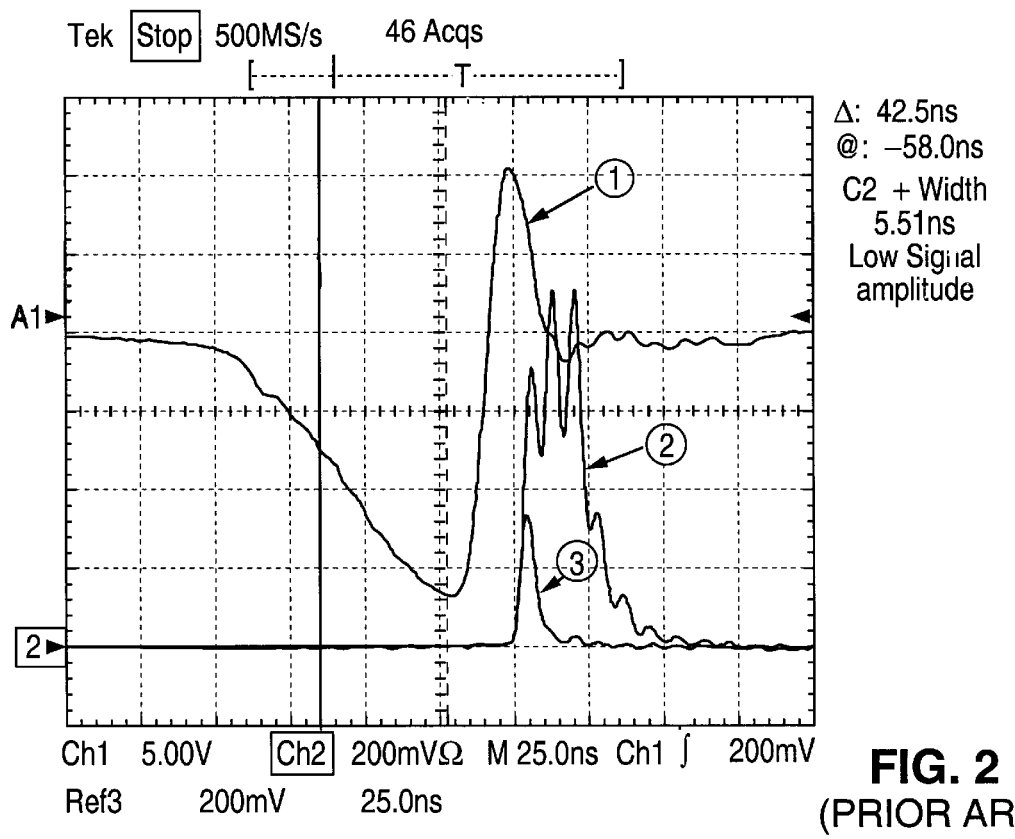
FIG. 2 illustrates waveforms associated with a laser pulse from a laser having the discharge circuit portion of FIG. 1.

In the conventional system shown schematically with respect to FIG. 1, sixteen peaking capacitors 38 having capacitances of 0.4 nF each were used to measure plots 1–3 of FIG. 2. The total peaking capacity was then $C_p$=6.4 nF. In order to make the inductances $L_p$ as small as practical, the capacitors were connected or mounted to the main discharge electrode 32a as close as possible to the center of the discharge, and the inductance $L_p$ is in the conducting connectors between the electrode 32a and peaking capacitors 48.

In the laser system according to the embodiments of FIGS. 4a and 4b, six peaking capacitors having a capacitance of 0.2 nF each were used to measure the plots 1–3 of FIG. 5, described below, and the resulting total peaking capacity was $C_p$=1.2 nF. Fourteen additional sustaining capacitors 50 were used having a capacitance of 0.4 nF each, resulting in a total sustaining capacity of $C_s$=5.6 nF. The peaking capacitors 48 were again placed as close as possible to the discharge while the sustaining capacitors 50 were mounted an enlarged distance to the discharge. The enlarged distance produced the increased inductivity between the sustaining capacitors 50 and the electrode 42a as compared with that of the peaking capacitors 48. The inductances $L_s$ (or $L_p+L_s'$) were, for the exemplary arrangements of FIGS. 4a and 4b, about 60% larger than the inductances $L_p$. Another amount of inductance may be selected in accordance with a desired spectral purity and gain considerations such as 25% or 50% or more.

Moreover, one skilled in the art would understand that the additional inductances $L_s-L_p$ or $L_s'$ could be added in other ways such as by inserting an inductive element such as a saturable core between the sustaining capacitors 50 and the electrode 42a. One skilled in the art would also understand that there are other ways to stretch the electrical pulse to achieve the desired reduction in ASE and enhancement of the spectral purity. Another method for stretching a second portion of the electrical pulse while allowing the first portion to reach the electrodes before the second portion may be used in accord with the present invention, for resulting in a temporally stretched electrical pulse applied to a pair of discharge electrodes. For example, the electrical pulse may be divided earlier in the pulse compression circuitry or even at the main storage capacitor (see, e.g., the U.S. Ser. No. 6,005,880 patent, wherein a single pair of discharge electrodes is used and the delays introduced according to the '880 patent be reduced in accord with the present invention such that a single electrical pulse is temporally stretched, rather than there being two distinct pulses discharged to two pairs of electrodes as set forth in the '880 patent; and see the U.S. Pat. No. 5,247,531, wherein the two pulses divided for application to preionization and main electrodes may be differently delayed, such as delaying only one of the divided portions of the pulse, and joined at the same main electrodes for stretching the pulse in accord with the invention).

Figure 5:
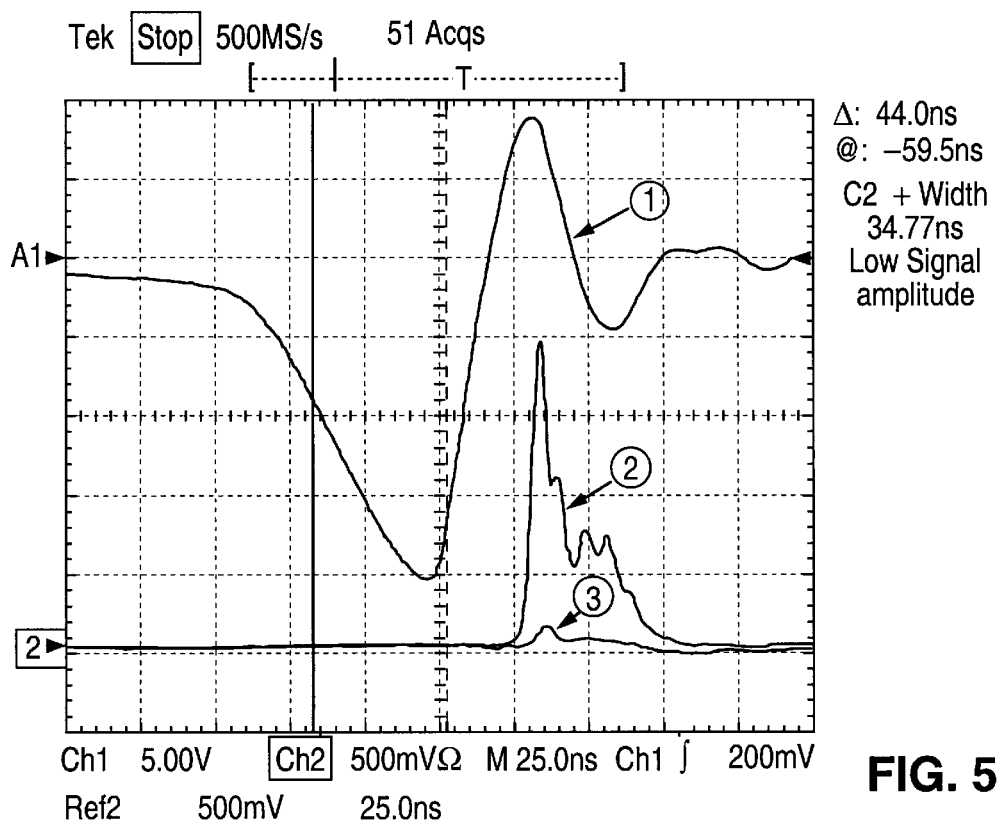
FIG. 5 illustrates waveforms associated with a laser pulse from a laser having the discharge circuit of either of FIGS. 4a–4b.

The waveforms measured using the preferred arrangements of final stage capacitors 48 and 50 of FIGS. 4a and 4b are shown at FIG. 5, and correspond to the waveforms shown and described with respect to FIG. 2 for the conventional arrangement of final stage peaking capacitors 38. As before, three plots are shown. The first labeled plot 1 is the waveform of the electrical pulse delivered to the main electrode 42a. The second labeled plot 2 is the waveform of the light pulse emitted from the laser resonator. The third labeled plot 3 is the waveform of the amplified spontaneous emission (ASE) emanating from the discharge volume. It is again noted that the amplitudes of the traces shown at FIG. 5 are not comparable because different signals were used.

A comparison of plot 3 of FIG. 5 and plot 3 of FIG. 2 clearly shows that the amplified spontaneous emission pulse of plot 3 of FIG. 5 is shifted in time to a later time in the laser emission than that of plot 3 of FIG. 2. This means that the line-narrowed light pulse having a narrow spectral bandwidth has already substantially fully developed by the time where the maximum of ASE would occur. As the narrow bandwidth light saturates the gain only a minimum of broadband ASE is contained in the laser output. Thus, the enlarged inductivity between the sustaining capacitors 50 and the electrode 42a results in an extended current pulse through the discharge and the desired reduced ASE level. That means the spectral purity is improved in accordance with the preferred embodiment. This advantageously leads to better contrast quality and homogeneity of the line density in wafer scanner and step applications.

In the exemplary embodiments set forth above with respect to FIGS. 4a, 4b and 5, the ASE background in the laser output pulse is reduced by more than 20× compared to the conventional arrangement described with respect to FIGS. 1 and 2. While measurement of a 248 nm laser with the arrangement from FIG. 1 yields an output pulse with approximately 5% ASE contained in the total laser emission, the arrangement of FIGS. 4a and 4b for the otherwise same laser yields an output pulse having approximately only 0.2% ASE. Depending on the degree of enhancement of the spectral purity desired and in view of gain considerations, it may be desired to reduce the ASE to another value such as 2% or 1% or 0.5% or less. The object of the invention to reduce the proportion of the ASE within the laser pulse in order to achieve greater spectral purity in the emitted line-narrowed beam is thus met according the preferred embodiments set forth above.

While exemplary drawings and specific embodiments of the present invention have been described and illustrated, it is to be understood that that the scope of the present invention is not to be limited to the particular embodiments discussed. Thus, the embodiments shall be regarded as illustrative rather than restrictive, and it should be understood that variations may be made in those embodiments by workers skilled in the arts without departing from the scope of the present invention as set forth in the claims that follow, and equivalents thereof.

In addition, in the method claims that follow, the steps have been ordered in selected typographical sequences. However, the sequences have been selected and so ordered for typographical convenience and are not intended to imply any particular order for performing the steps, except for those claims wherein a particular ordering of steps is expressly set forth or understood by one of ordinary skill in the art as being necessary.

What is claimed is:

1. An illumination photolithography system for producing structures on a workpiece, comprising:
an excimer or molecular fluorine laser system; and
an imaging system for delivering output pulses emitted from said laser system to said workpiece,
wherein said laser system comprises:
a discharge chamber filled with a laser gas mixture;
a plurality of electrodes within said discharge chamber connected to a pulsed discharge circuit for energizing the gas mixture; and
a resonator including the discharge chamber for generating an output laser beam,
wherein said pulsed discharge circuit comprises:
a high voltage power supply;
a main storage capacitor which is charged by the power supply;
a pulse compression circuit; and
a switch for permitting said storage capacitor to discharge through the pulse compression circuit to said electrodes,
wherein said pulse compression circuit comprises:
one or more pulse compression stages each including a stage capacitance and being separated by a stage inductance, wherein a final stage capacitance is provided by:
a set of peaking capacitors connected to said electrodes through a first inductance; and
a set of sustaining capacitors connected to said electrodes through a second inductance greater than the first inductance by at least 25%, such that current pulses through the discharge are temporally extended due to the first and second inductances differing substantially such that different electrical charges are applied to the electrodes from the set of peaking capacitors and from the set of sustaining capacitors across a temporally extended range wherein first electrical charges applied to the electrodes from the peaking capacitors initiate the discharge and different, delayed, second electrical charges applied to the electrodes from the sustaining capacitors temporally extend the discharge, and an amplified spontaneous emission (ASE) level in said pulses is reduced thereby enhancing spectral purity of said output beam.

2. A excimer or molecular fluorine laser system, comprising:
a discharge chamber filled with a laser gas mixture;
a plurality of electrodes within said discharge chamber connected to a pulsed discharge circuit for energizing the gas mixture; and
a resonator including the discharge chamber for generating an output laser beam,
wherein said pulsed discharge circuit comprises:
a high voltage power supply;
a main storage capacitor which is charged by the power supply;
a pulse compression circuit; and
a switch for permitting said storage capacitor to discharge through the pulse compression circuit to a said electrodes,
wherein said pulse compression circuit comprises:
one or more pulse compression stages each including a stage capacitance and being separated by a stage inductance, wherein a final stage capacitance is provided by:
a set of peaking capacitors connected to said electrodes through a first inductance; and
a set of sustaining capacitors connected to said electrodes through a second inductance greater than the first inductance by at least 25%, such that current pulses through the discharge are temporally extended due to the first and second inductances differing substantially such that different electrical charges are applied to the electrodes from the set of peaking capacitors and from the set of sustaining capacitors across a temporally extended range wherein first electrical charges applied to the electrodes from the peaking capacitors initiate the discharge and different, delayed, second electrical charges applied to the electrodes from the sustaining capacitors temporally extend the discharge, and an amplified spontaneous emission (ASE) level in said pulses is reduced thereby enhancing spectral purity of said output beam.

3. The system of any of claims 1 or 2, wherein a difference between said first and second inductances is sufficient to reduce the background ASE to less than 2%.

4. The system of any of claims 1 or 2, wherein a difference between said first and second inductances is sufficient to reduce the background ASE to less than 1%.

5. The system of any of claims 1 or 2, wherein a difference between said first and second inductances is sufficient to reduce the background ASE to less than 0.5%.

6. The system of any of claims 1 or 2, wherein more than half of said final stage capacitance is provided by said sustaining capacitors.

7. The system of any of claims 1 or 2, wherein more than two-thirds of said final stage capacitance is provided by said sustaining capacitors.

8. The system of any of claims 1 or 2, wherein said second inductance is more than 50% larger than said first inductance.

9. The system of any of claims 1 or 2, wherein said gas mixture comprises krypton, fluorine and a buffer gas, and said laser emits around 248 nm.

10. The system of any of claims 1 or 2, wherein said gas mixture comprises argon, fluorine and a buffer gas, and said laser emits around 193 nm.

11. The system of any of claims 1 or 2, wherein said gas mixture comprises fluorine and a buffer gas, and said laser emits around 157 nm.

12. A pulsed discharge circuit for an excimer or molecular fluorine laser system, comprising:
- a high voltage power supply;
- a main storage capacitor which is charged by the power supply;
- a pulse compression circuit; and
- a switch for permitting said storage capacitor to discharge through the pulse compression circuit to a said electrodes,
- wherein said pulse compression circuit comprises:
- one or more pulse compression stages each including a stage capacitance and being separated by a stage inductance, wherein a final stage capacitance is provided by:
- a set of peaking capacitors connected to said electrodes through a first inductance; and
- a set of sustaining capacitors connected to said electrodes through a second inductance greater than the first inductance by at least 25%, such that current pulses through the discharge are temporally extended due to the first and second inductances differing substantially such that different electrical charges are applied to the electrodes from the set of peaking capacitors and from the set of sustaining capacitors across a temporally extended range wherein first electrical charges applied to the electrodes from the peaking capacitors initiate the discharge and different, delayed, second electrical charges applied to the electrodes from the sustaining capacitors temporally extend the discharge, and an amplified spontaneous emission (ASE) level in said pulses is reduced thereby enhancing spectral purity of said output beam.

13. A pulse compression circuit for a pulser unit of an excimer or molecular fluorine laser system, comprising:
- one or more pulse compression stages each including a stage capacitance and being separated by a stage inductance, wherein a final stage capacitance is provided by:
- a set of peaking capacitors connected to said electrodes through a first inductance; and
- a set of sustaining capacitors connected to said electrodes through a second inductance greater than the first inductance by at least 25%, such that current pulses through the discharge are temporally extended due to the first and second inductances differing substantially such that different electrical charges are applied to the electrodes from the set of peaking capacitors and from the set of sustaining capacitors across a temporally extended range wherein first electrical charges applied to the electrodes from the peaking capacitors initiate the discharge and different, delayed, second electrical charges applied to the electrodes from the sustaining capacitors temporally extend the discharge, and an amplified spontaneous emission (ASE) level in said pulses is reduced thereby enhancing spectral purity of said output beam.

14. The circuit of any of claims 12 or 13, wherein a difference between said first and second inductances is sufficient to reduce the background ASE to less than 2%.

15. The circuit of any of claims 12 or 13, wherein a difference between said first and second inductances is sufficient to reduce the background ASE to less than 1%.

16. The circuit of any of claims 12 or 13, wherein a difference between said first and second inductances is sufficient to reduce the background ASE to less than 0.5%.

17. The circuit of any of claims 12 or 13, wherein more than half of said final stage capacitance is provided by said sustaining capacitors.

18. The circuit of any of claims 12 or 13, wherein more than two-thirds of said final stage capacitance is provided by said sustaining capacitors.

19. The circuit of any of claims 12 or 13, wherein said second inductance is more than 50% larger than said first inductance.

20. A method of improving spectral purity of an output beam of an excimer or molecular fluorine gas discharge laser system which includes a pulser circuit for providing current pulses to electrodes within a gas filled chamber for energizing the gas, and the pulser circuit includes a main storage capacitor coupled with a power supply and a switch for discharging the main storage capacitor to said electrodes through a pulse compression circuit having one or more capacitance stages separated by inductances, comprising the steps of:
- selecting a subset of final stage pulse compression circuit capacitors connected to said electrodes and representing a certain proportion of an overall capacitance of the final stage capacitors; and
- inserting an additional at least 25% inductance between said final stage capacitors of said selected subset and main discharge electrodes of said laser system to an original inductance such as remains between unselected final stage pulse compression circuit capacitors and the main electrodes,
- wherein current pulses through the discharge are temporally extended due to the first and second inductances differing substantially such that different electrical charges are applied to the electrodes from the set of peaking capacitors and from the set of sustaining capacitors across a temporally extended range wherein first electrical charges applied to the electrodes from the peaking capacitors initiate the discharge and different, delayed, second electrical charges applied to the electrodes from the sustaining capacitors temporally extend the discharge and a proportion of a broadband background amplified spontaneous emission (ASE) of said output beam is thereby reduced, and the spectral purity of the output beam is thereby improved.

21. The method of claim 20, wherein said additional inductance is sufficient to reduce the broadband background ASE of said output beam to less than 2%.

22. The method of claim 20, wherein said additional inductance is sufficient to reduce the broadband background ASE of said output beam to less than 1%.

23. The method of claim 20, wherein said additional inductance is sufficient to reduce the broadband background ASE of said output beam to less than 0.5%.

24. The method of any of claims 20 or 21, wherein said subset of said final stage capacitors selected provides more than half of said overall capacitance of the final stage capacitors.

25. The method of any of claims 20 or 21, wherein said subset of said final stage capacitors selected provides more than two-thirds of said overall capacitance of the final stage capacitors.

26. The method of claim 24, wherein said additional inductance is more than 50% of the original inductance.

27. The method of any of claims 20 or 21, wherein said additional inductance is more than 50% of the original inductance.

28. A method of improving spectral purity of an output beam of an excimer or molecular fluorine gas discharge laser system which includes a pulser circuit for providing current pulses to electrodes having a discharge area therebetween within a gas filled chamber for energizing the gas, and the pulser circuit includes a main storage capacitor coupled with a power supply and a switch for discharging the main storage capacitor to said electrodes through a pulse compression circuit having one or more capacitance stages separated by inductances, wherein a final stage capacitance is provided by a set of peaking capacitors connected to said electrodes through a first inductance, and a set of sustaining capacitors connected to said electrodes through a second inductance greater than the first inductance by at least 25%, comprising the steps of:

discharging an electrical pulse through said pulser circuit to said electrodes; and delaying a second portion of said electrical pulse prior to reaching said electrodes such that a first portion reaches said electrodes before said second portion due to the first and second inductances differing substantially such that different electrical charges are applied to the electrodes from the set of peaking capacitors and from the set of sustaining capacitors across a temporally extended range wherein first electrical charges applied to the electrodes from the peaking capacitors initiate the discharge and different, delayed, second electrical charges applied to the electrodes from the sustaining capacitors temporally extend the discharge, wherein current pulses through the discharge are temporally extended and a proportion of a broadband background amplified spontaneous emission (ASE) of said output beam is thereby reduced, and the spectral purity of the output beam is thereby improved.

29. The method of claim 28, wherein said delay of said second portion of said electrical pulse is sufficient to reduce the broadband background ASE of said output beam to less than 2%.

30. The method of claim 28, wherein said delay of said second portion of said electrical pulse is sufficient to reduce the broadband background ASE of said output beam to less than 1%.

31. The method of claim 28, wherein said delay of said second portion of said electrical pulse is sufficient to reduce the broadband background ASE of said output beam to less than 0.5%.

32. The method of any of claims 28 or 29, wherein said second portion of said electrical pulse includes more than half of the total electrical pulse.

33. The method of any of claims 28 or 29, wherein said second portion of said electrical pulse includes more than two-thirds of the total electrical pulse.

* * * * *